United States Patent
Krishnaraj et al.

(10) Patent No.: US 6,890,597 B2
(45) Date of Patent: May 10, 2005

(54) HDP-CVD UNIFORMITY CONTROL

(75) Inventors: Padmanabhan Krishnaraj, San Francisco, CA (US); Bruno Geoffrion, San Jose, CA (US); Michael S. Cox, Davenport, CA (US); Lin Zhang, San Jose, CA (US); Bikram Kapoor, Santa Clara, CA (US); Anchuan Wang, Fremont, CA (US); Zhenjiang Cui, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 68 days.

(21) Appl. No.: 10/435,296

(22) Filed: May 9, 2003

(65) Prior Publication Data

US 2004/0224090 A1 Nov. 11, 2004

(51) Int. Cl.[7] .............................................. C23C 16/40
(52) U.S. Cl. ............................. 427/248.1; 427/255.37; 427/355; 438/692; 438/697; 438/788
(58) Field of Search .................................. 438/692, 697, 438/788; 427/248.1, 255.37, 355

(56) References Cited

U.S. PATENT DOCUMENTS

| | | | |
|---|---|---|---|
| 5,738,574 A | | 4/1998 | Tolles et al. |
| 5,903,106 A | * | 5/1999 | Young et al. ............ 315/111.41 |
| 6,015,591 A | * | 1/2000 | Li et al. ................. 427/255.23 |
| 6,107,186 A | * | 8/2000 | Erb ............................. 438/633 |
| 6,271,138 B1 | * | 8/2001 | Chang et al. ............... 438/691 |
| 6,329,297 B1 | | 12/2001 | Balish et al. |
| 6,406,359 B1 | | 6/2002 | Birang et al. |
| 6,596,654 B1 | * | 7/2003 | Bayman et al. ............. 438/788 |
| 6,620,726 B1 | * | 9/2003 | Preusse et al. .............. 438/633 |

* cited by examiner

*Primary Examiner*—Timothy Meeks
(74) *Attorney, Agent, or Firm*—Townsend and Townsend and Crew (57) ABSTRACT

A combination of deposition and polishing steps are used to permit improved uniformity of a film after the combination of steps. Both the deposition and polishing are performed with processes that vary across the substrate. The combination of the varying deposition and etching rates results in a film that is substantially planar after the film has been polished. In some instances, it may be easier to control the variation of one of the two processes than the other so that the more controllable process is tailored to accommodate nonuniformities introduced by the less controllable process.

22 Claims, 11 Drawing Sheets

HDP-CVD UNIFORMITY CONTROL

BACKGROUND OF THE INVENTION

One of the primary steps in the fabrication of modem semiconductor devices is the formation of a film on a semiconductor substrate. This deposition may take place by a number of different processes, including chemical-vapor-deposition ("CVD") processes in which the film is formed through a chemical reaction of gases. Conventional thermal CVD processes supply reactive gases to the surface of the substrate where heat-induced chemical reactions take place to produce the desired film. Plasma-enhanced CVD ("PECVD") techniques instead promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, thus lowering the temperature required for such CVD processes when compared with conventional thermal CVD processes. These advantages are further exploited by high-density-plasma ("HDP") CVD techniques, in which a dense plasma is formed at low vacuum pressures so that the plasma species are even more reactive.

The deposition of the film may be followed with a polishing step to eliminate irregularities in the surface of the film that may result from the deposition process. One such polishing step may use chemical mechanical polishing ("CMP") in which a mechanical buffing process is combined with a chemical removal process. The polishing step may have specific uniformity characteristics, depending on the type of technique used and perhaps also depending on the way that technique is implemented. Consequently, the deposited and polished film may include undesirable uniformity irregularities that interfere with further fabrication of the semiconductor device, and perhaps also with the operation of the completed semiconductor device.

Figure 1:
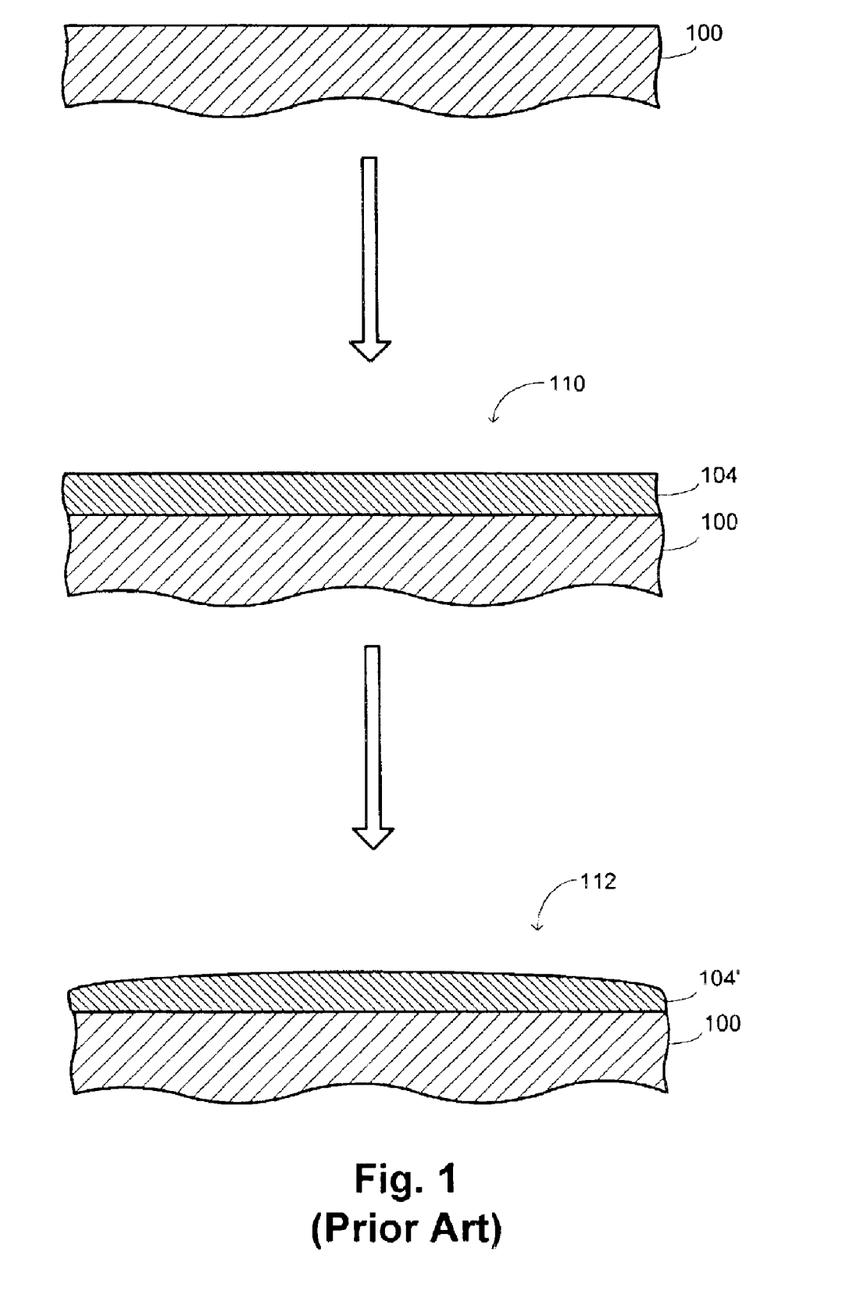
FIG. 1 is a schematic diagram illustrating the effect of a nonuniform CMP process on a deposited film.

Such a combination of the deposition and polishing processes is illustrated in FIG. 1. The process begins at the top of the figure with a substrate 100 over which a film 104 is deposited to produce the intermediate structure 110 shown in the middle of the figure. This film 104 is shown as substantially planar after the deposition process, but a subsequent CMP process performed with a tool that etches the periphery of the film faster than the center results in the final structure 112 shown at the bottom of the figure. Because of the combination of the deposition and polishing processing, the final film 104' is not planar.

There is, therefore, a general need in the art for a technique that permits forming a substantially planar film that accounts for uniformity irregularities in the polishing process.

BRIEF SUMMARY OF THE INVENTION

Embodiments of the invention thus provide a combination of deposition and polishing steps that permit improved uniformity of a film after the combination of steps. Both the deposition and polishing are performed with processes that vary across the substrate. The combination of the varying deposition and etching rates results in a film that is substantially planar after the film has been polished. In some instances, it may be easier to control the variation of one of the two processes than to control the variation of the other; in such instances, the more controllable process may be tailored to accommodate nonuniformities introduced by the less controllable process. For example, where the nonuniformities introduced by the polishing process are more difficult to control, the deposition process may be adjusted to introduce a compensatory nonuniformity. In one embodiment, such a polishing process comprises a chemical mechanical polishing process. In cases where the polishing process etches the periphery of the film more than the center of the film, the compensatory nonuniformity provided by the deposition process may result from a higher deposition rate at the periphery than at the center. In some embodiments, the film has a uniformity less than 1% after polishing the film. This may reflect a reduction from a uniformity that is greater than 1% after depositing the film but before polishing. In one embodiment, this uniformity before polishing is between 5% and 7%.

The requisite control over the deposition process may be provided by a plasma CVD process, such as an HDP-CVD process, in which a process gas comprising precursor gases and a fluent gas is flowed into a process chamber, and a plasma generated from the process gas. The precursor gases may comprise a silane and an oxygen-containing gas. The fluent gas may comprise an inert gas, such as He, and in some instances may comprise a premixture that includes an inert gas. In other embodiments, the fluent gas may comprise $H_2$. In a plasma CVD process, the control over the deposition process may be provided by using top and side gas sources for the flow of the fluent gas. A suitable ratio for the flow of the fluent gas through the side gas source to the flow of the fluent gas through the top gas source is between 0.1 and 50. The total flow rate for the fluent gas may be between 10 and 1000 sccm.

A further understanding of the nature and advantages of the present invention may be realized by reference to the remaining portions of the specification and the drawings.

DETAILED DESCRIPTION OF THE INVENTION

Embodiments of the invention are directed to methods for forming a substantially planar film over a substrate. The methods use both a deposition step and a polishing step, with the deposition step having a deposition rate that varies across the substrate and compensates for variations in etch rate during the subsequent polishing step. In many instances, the concept of a substantially planar film may be different from the concept of a uniform film. For example, while FIG. 1 shows an example of a film 104 that is both uniform and planar, in many situations the film may be uniform across the film in that its thickness varies less than a certain amount, but may be nonplanar because it is deposited over raised features.

Figure 2:
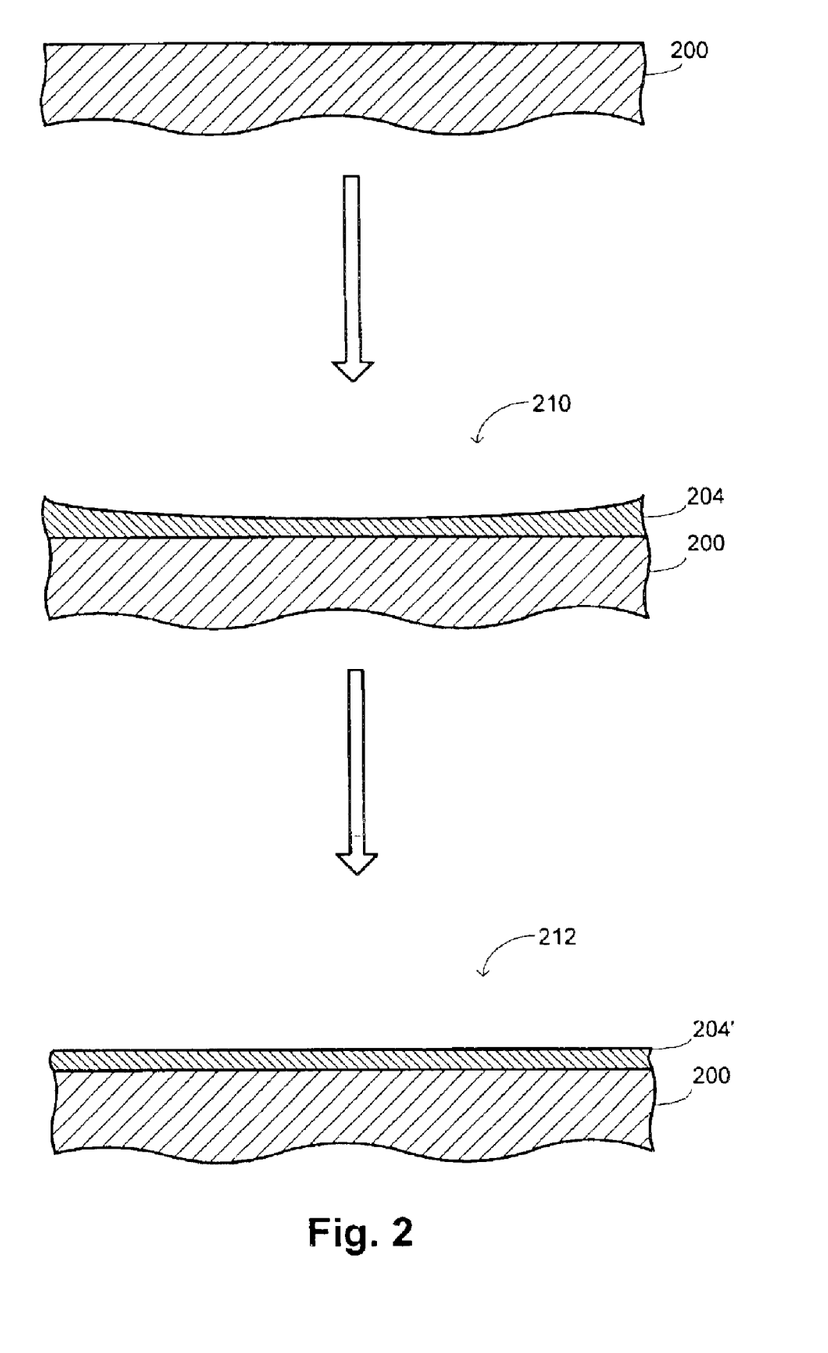
FIG. 2 is a schematic diagram illustrating the formation of a substantially planar film in accordance with an embodiment of the invention.

The overall process is illustrated for one embodiment in FIG. 2, beginning with a substrate at the top of the figure. The film 204 is deposited using a deposition process having a deposition rate that varies radially from the center of the substrate to produce the intermediate structure 210 shown in the middle of FIG. 2. In the embodiment illustrated, the deposition process is configured to produce a higher deposition rate at the periphery of the substrate 200 than at its center. This is suitable for accommodating a subsequent polishing that provides a greater etching at the periphery, which produces the final structure 212 shown at the bottom of FIG. 2 with a substantially planar final film 204'. In other embodiments, the deposition rate at the periphery of the substrate 200 may be lower than at its center, such as to accommodate subsequent polishing steps that provide greater etching in the center of the substrate.

To achieve a substantially uniform film after the polishing step, it is preferable that the deposition and etch rates for the respective deposition and polishing steps approximately correspond. This is illustrated schematically in FIGS. 3A and 3B, which respectively show the etch rate for the polishing step and the deposition rate for the deposition step. In many instances, it is possible to control the uniformity of one of the two steps with greater precision that the other step. For example, the deposition techniques described further below permit more precise control over the shape of the film after the deposition than do commonly used CMP techniques. Accordingly, one of the two profiles shown in FIGS. 3A and 3B may be an experimentally determined profile for that technique while the other profile represents a desired profile to be achieved with the more precise technique.

Figure 3A:
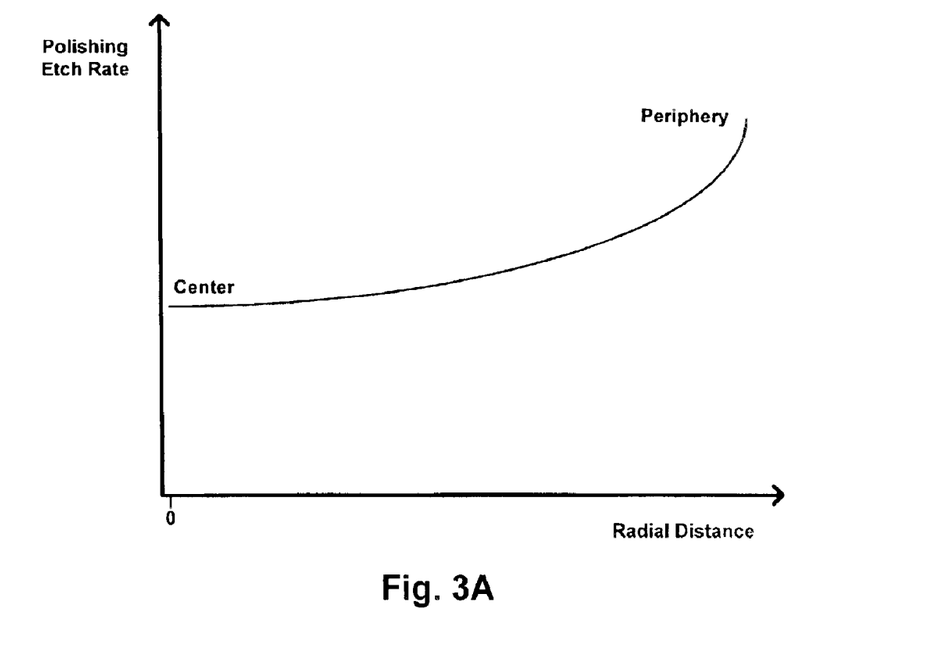
FIGS. 3A and 3B provide graphical illustrations of a desired relationship between CMP etch rate and deposition thickness to achieve a substantially planar film in embodiments of the invention.
Figure 3B:
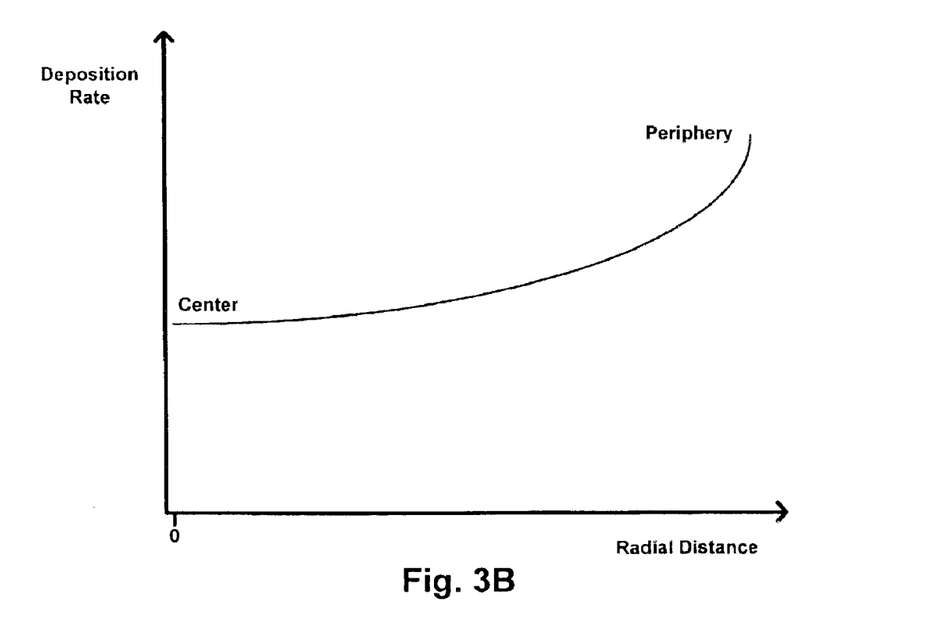

For this reason, the curve for the polishing step is shown first, in FIG. 3A, even though it is performed after the deposition step. This illustrates the sequence by which parameters are defined for the overall film-formation technique in a case where more precise control may be exerted over the deposition step than the polishing step. In such an instance, the curve shown in FIG. 3A may represent an experimentally determined profile for the etch rate provided by the polishing step. The curve shown in FIG. 3B may then represent the desired profile for the preceding deposition step, which may then be realized in some embodiments by implementation of the uniformity-control techniques described below. In other embodiments, it may instead be possible to control the polishing step more precisely than the deposition step, in which case the curve shown in FIG. 3B may be an experimentally determined curve used to determine the desired profile for the polishing step in FIG. 3A. Also, while the example of FIGS. 3A and 3B illustrates a process in which the deposition and etching are both greater at the periphery than at the center, the same principle may be used with other deposition and etching profiles. For example, the deposition and etching may both be greater at the center than at the periphery.

Figure 4:
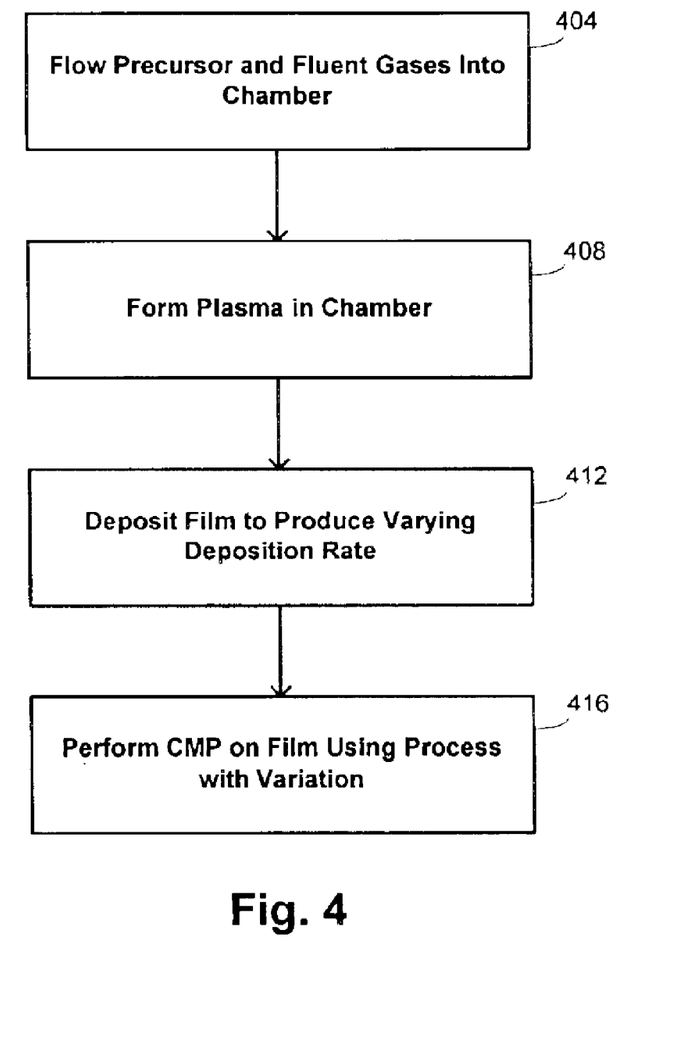
FIG. 4 provides a flow diagram illustrating a method for forming a film in accordance with an embodiment of the invention.

FIG. 4 provides a flow diagram that illustrates the process in an embodiment with a specific method for performing the deposition. This method uses a plasma-based CVD process, such as HDP-CVD, to perform the deposition. At block 404, precursor and fluent gases are flowed into a process chamber. The elements comprised by the precursor gases react to form the film with the desired composition. For example, to deposit a silicon oxide film, the precursor gases may include a silicon-containing gas, such as silane $SiH_4$, and an oxygen-containing gas, such as $O_2$. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. The fluent gas may act as a sputtering agent so that the deposition process includes simultaneous deposition and sputtering characteristics. The fluent gas may be provided with a flow of $H_2$ or with a flow of an inert gas, including a flow of He, a flow of Ne, a flow of Ar, or a flow of a heavier inert gas such as Xe. The level of sputtering provided by the different fluent gases is inversely related to their atomic mass (or molecular mass in the case of $H_2$), with $H_2$ producing even less sputtering than He.

A plasma is formed from the gases at block 408. In some instances, the plasma may have an ionic density greater than $10^{11}$ ions/cm$^3$, in which case the process is considered to be an HDP-CVD process. The deposition conditions are provided at block 412 in a manner that deposits the film with the desired variation in deposition rate across the film. In one embodiment, this may be performed by exploiting the simultaneous deposition and sputtering characteristics of the process. In particular, a split flow is used for the fluent gas, with the gas being flowed through both top and side gas sources. The difference in flow of the fluent gas through the differently positioned sources provides different sputtering characteristics at different points on the substrate, thereby providing a variation in overall deposition rates. Notably, the use of a split flow of fluent gas in this manner provides the variation in deposition rate without changing the flow characteristics of the precursor gases. FIG. 4 notes at block 416 that the polishing may be performed with a CMP process that has an etching variation over the film.

Figure 5A:
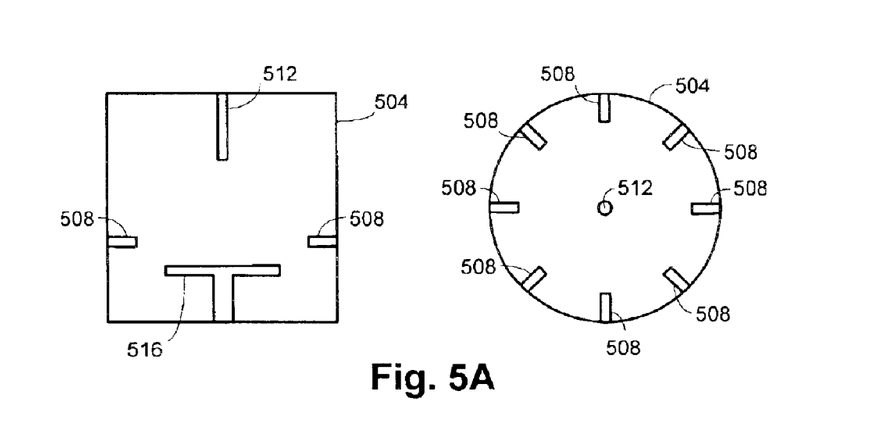
FIGS. 5A–5C provide schematic diagrams of examples of various process chamber configurations that may be used with embodiments of the invention.
Figure 5B:
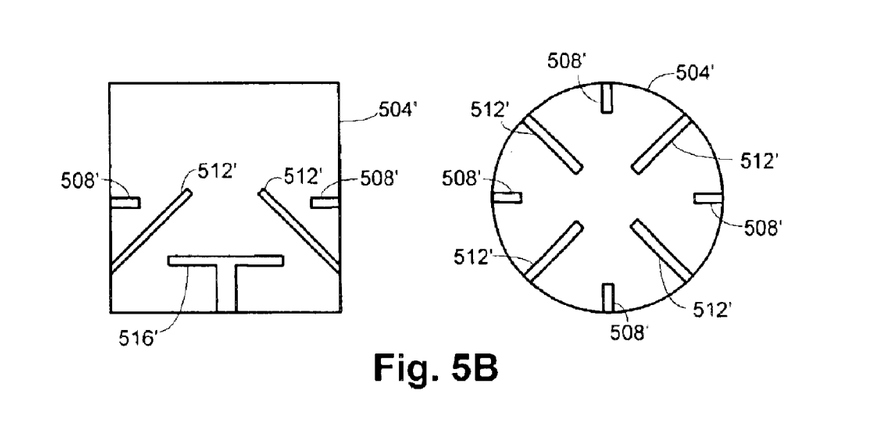
Figure 5C:
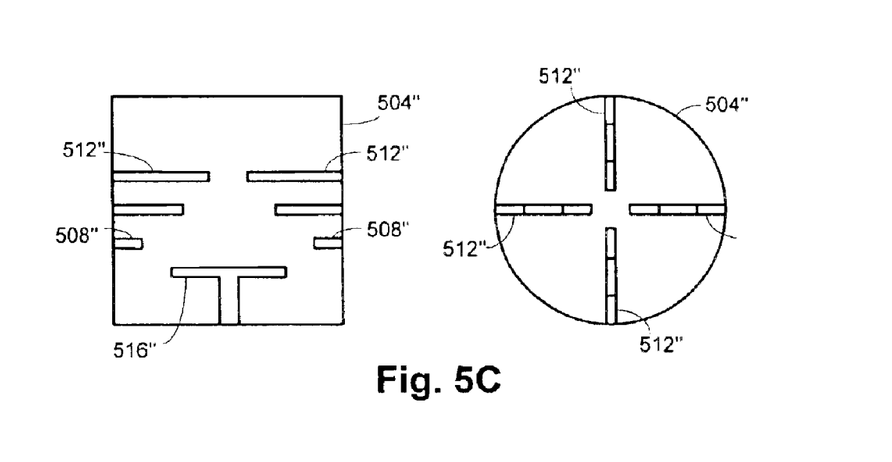

There are a variety of different process-chamber configurations that may be used to implement the split fluent-gas flow, some of which are illustrated schematically in FIGS. 5A–5C. In each of these figures, the left portion of the figure shows a side view of the system while the right portion shows a top view. The structure shown in FIG. 5A includes a substrate receiving portion 516 within the process chamber 504, and exemplifies the side gas source with a plurality of side gas nozzles 508 and the top gas source with a top gas nozzle 512. As used herein, the terms "side gas source" and "top gas source" are intended to be interpreted broadly, with the "top gas source" being any gas source configured to provide a supply of gas above the substrate receiving portion 516 and the "side gas source" being any gas source configured to provide a supply of gas at the periphery of the substrate receiving portion 516.

Thus, an alternative configuration that also has top and side gas sources is shown in FIG. 5B, in which the components are denoted with single primes. In this configuration, side gas nozzles 508' within the process chamber 504' act as side gas sources because they are configured to provide a supply of gas at the periphery of the substrate receiving portion 516'. Similarly, nozzles 512' act as top gas sources because they provide a supply of gas above the substrate receiving portion 516'. There is no requirement that a top gas source be configured so that the gas supply enter directly from the top of the process chamber.

Another alternative configuration is shown in FIG. 5C, in which the components are denoted with double primes. In this instance, the side gas sources are provided as nozzles 508" that are shorter and lower in the chamber to provide a supply of gas at the periphery of the substrate receiving portion 516". The top gas sources are provided as parallel nozzles 512" that are longer and higher in the process chamber 504" to provide a supply of gas above the substrate receiving portion 516". In this configuration, intermediate nozzles are also provided between the top and side gas sources, and may be used to affect the relative flow of gases above and towards the periphery of the substrate receiving portion 516". Similar intermediate nozzles may be used in other configurations as well, and may be used in particular in applications where the deposition profile discussed in connection with FIG. 3B is not radially monotonic.

Another factor that may affect the deposition profile is the choice of fluent gas to be used, which may affect the relative deposition and sputtering contributions to the process. In one embodiment, the fluent gas comprises He, the use of which is described further in copending, commonly assigned U.S. patent appl. Ser. No. 10/137,132, entitled "METHOD FOR HIGH ASPECT RATIO HDP CVD GAPFILL," filed Apr. 30, 2002 by Zhong Qiang Hua et al., the entire disclosure of which is herein incorporated by reference for all purposes. In another embodiment, the fluent gas comprises $H_2$. In some instances, the fluent gas may comprise a plurality of gases, which may be provided as separate flows or as a premixture of gases. In specific embodiments, the fluent gas is provided by a flow from a premixture of He and Ar, such as with greater than 95 wt. % He or greater than 99 wt. % He, or by a flow of a premixture of He and $H_2$. Such a premixture provides a different average molecular weight for the fluent gas, which may affect uniformity characteristics. Also, there may be a significant cost savings even with a relatively small dilution of a costly fluent gas (such as He) by a less costly gas (such as Ar).

The specific flow rates of the fluent gas may be chosen to accommodate particular applications and produce a deposited film with the desired deposition profile. In certain embodiments, the total flow rate of the fluent gas is between 10 and 1000 sccm. In some such embodiments, the ratio of the flow provided by side sources to the flow provided by top sources is between 0.1 and 50.

Exemplary High Density Plasma Chamber

Figure 6A:
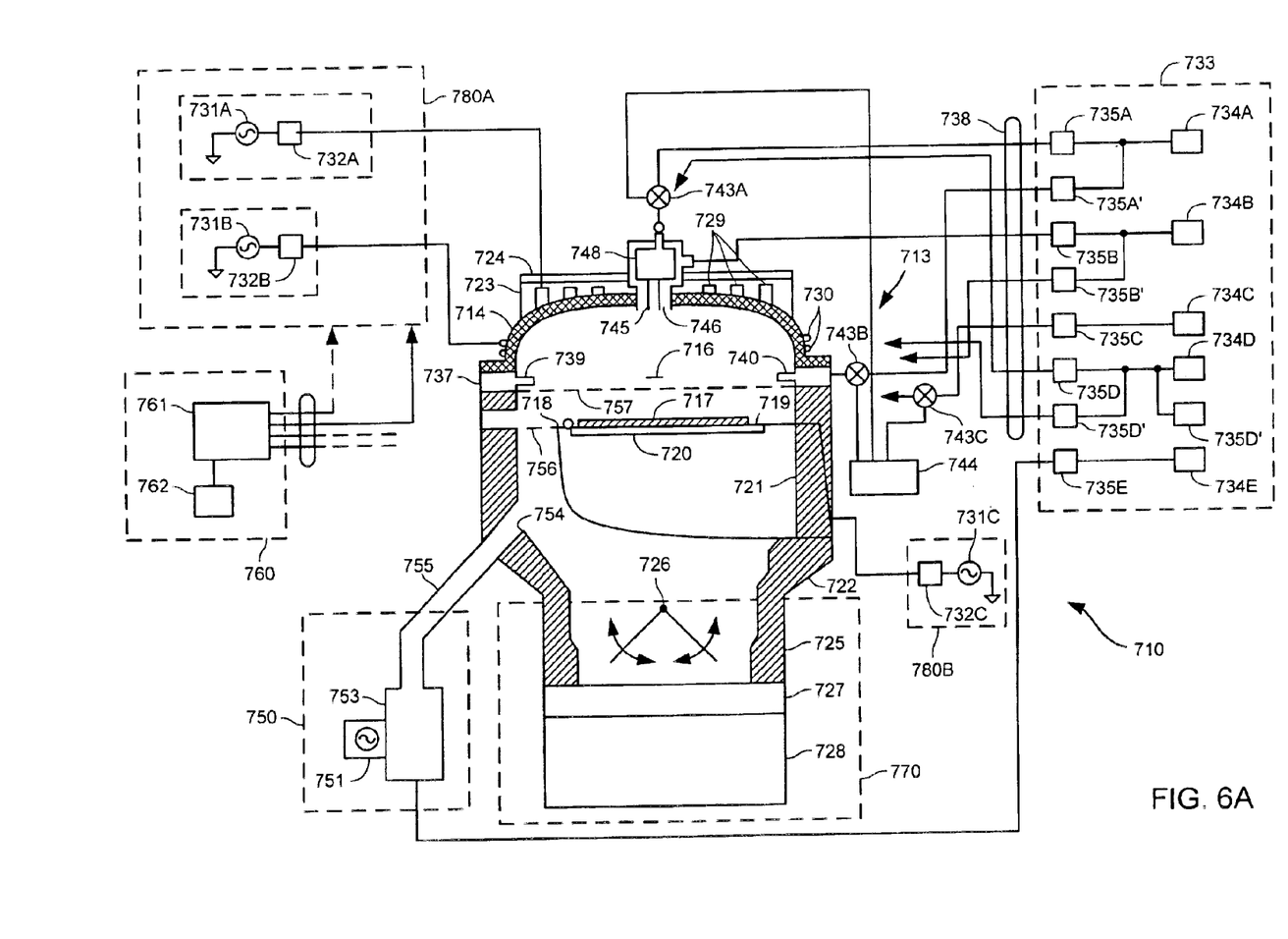
FIG. 6A is a simplified diagram of one embodiment of a high-density plasma chemical vapor deposition system according to the present invention.

A detailed description is provided in connection with FIGS. 6A–6D of an HDP-CVD system that may be used to perform the deposition described above. This exemplary system has a structure that corresponds approximately to the structure discussed in connection with FIG. 5A, although other configurations may alternatively be used. FIG. 6A schematically illustrates the structure of such an HDP-CVD system 710 in one embodiment. The system 710 includes a chamber 713, a vacuum system 770, a source plasma system 780A, a bias plasma system 780B, a gas delivery system 733, and a remote plasma cleaning system 750.

The upper portion of chamber 713 includes a dome 714, which is made of a ceramic dielectric material, such as aluminum oxide or aluminum nitride. Dome 714 defines an upper boundary of a plasma processing region 716. Plasma processing region 716 is bounded on the bottom by the upper surface of a substrate 717 and a substrate support member 718.

A heater plate 723 and a cold plate 724 surmount, and are thermally coupled to, dome 714. Heater plate 723 and cold plate 724 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 713 includes a body member 722, which joins the chamber to the vacuum system. A base portion 721 of substrate support member 718 is mounted on, and forms a continuous inner surface with, body member 722. Substrates are transferred into and out of chamber 713 by a robot blade (not shown) through an insertion/removal opening (not shown) in the side of chamber 713. Lift pins (not shown) are raised and then lowered under the control of a motor (also not shown) to move the substrate from the robot blade at an upper loading position 757 to a lower processing position 756 in which the substrate is placed on a substrate receiving portion 719 of substrate support member 718. Substrate receiving portion 719 includes an electrostatic chuck 720 that secures the substrate to substrate support member 718 during substrate processing. In a preferred embodiment, substrate support member 718 is made from an aluminum oxide or aluminum ceramic material.

Vacuum system 770 includes throttle body 725, which houses twin-blade throttle valve 726 and is attached to gate valve 727 and turbo-molecular pump 728. It should be noted that throttle body 25 offers minimum obstruction to gas flow, and allows symmetric pumping. Gate valve 727 can isolate pump 728 from throttle body 725, and can also control chamber pressure by restricting the exhaust flow capacity when throttle valve 726 is fully open. The arrangement of the throttle valve, gate valve, and turbo-molecular pump allow accurate and stable control of chamber pressures from between about 1 millitorr to about 2 torr.

The source plasma system 780A includes a top coil 729 and side coil 730, mounted on dome 714. A symmetrical ground shield (not shown) reduces electrical coupling between the coils. Top coil 729 is powered by top source RF (SRF) generator 731A, whereas side coil 730 is powered by side SRF generator 731B, allowing independent power levels and frequencies of operation for each coil. This dual coil system allows control of the radial ion density in chamber 713, thereby improving plasma uniformity. Side coil 730 and top coil 729 are typically inductively driven, which does not require a complimentary electrode. In a specific embodiment, the top source RF generator 731A provides up to 2,500 watts of RF power at nominally 2 MHz and the side source RF generator 731B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 780B includes a bias RF ("BRF") generator 731C and a bias matching network 732C. The bias plasma system 780B capacitively couples substrate portion 717 to body member 722, which act as complimentary electrodes. The bias plasma system 780B serves to enhance the transport of plasma species (e.g., ions) created by the source plasma system 780A to the surface of the substrate. In a specific embodiment, bias RF generator provides up to 5,000 watts of RF power at 13.56 MHz.

RF generators 731A and 731B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 732A and 732B match the output impedance of generators 731A and 731B with their respective coils 729 and 730. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 6B:
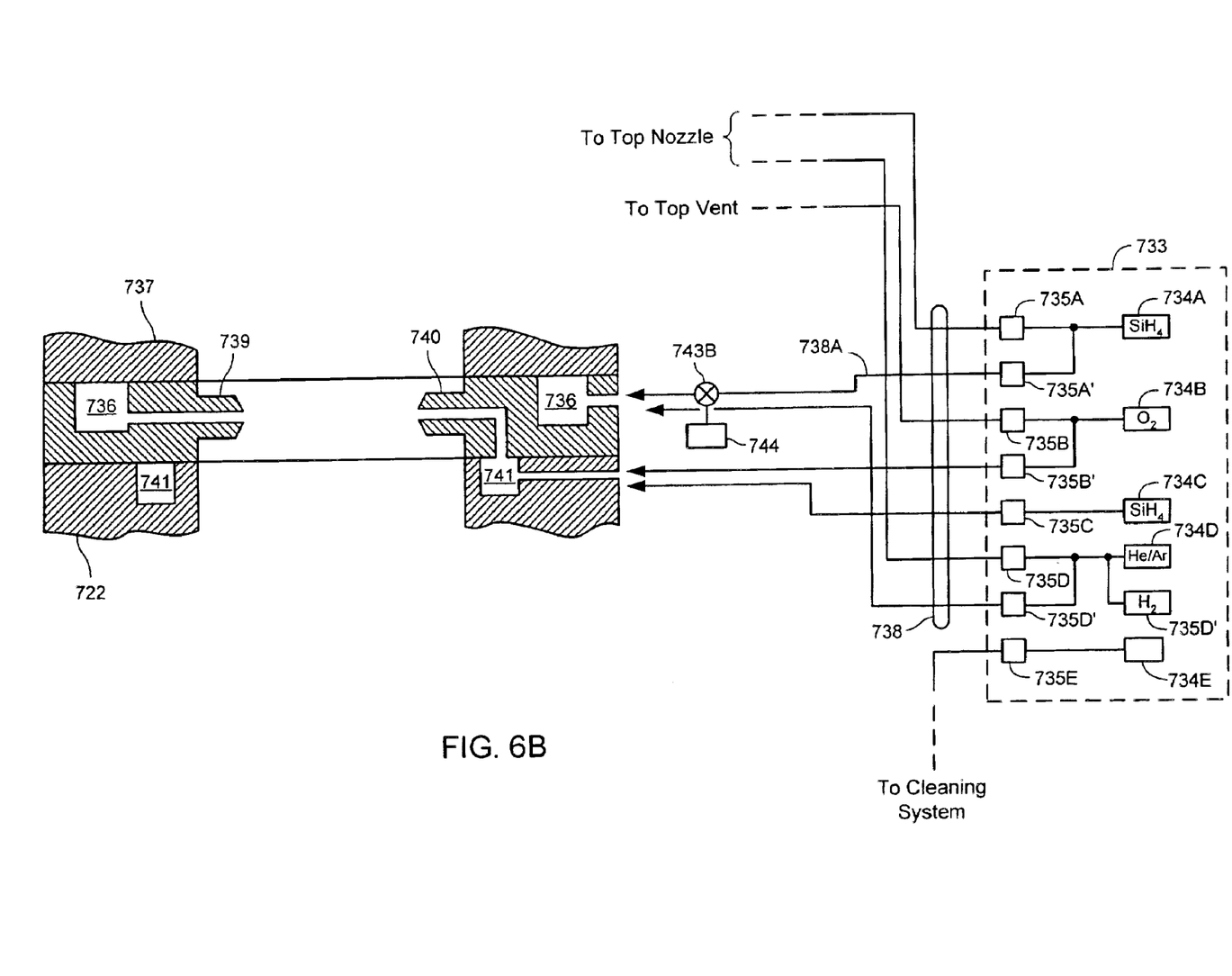
FIG. 6B is a simplified cross section of a gas ring that may be used in conjunction with the exemplary CVD processing chamber of FIG. 2A.

A gas delivery system 733 provides gases from several sources, 734A–734E chamber for processing the substrate via gas delivery lines 738 (only some of which are shown). As would be understood by a person of skill in the art, the actual sources used for sources 734A–734E and the actual connection of delivery lines 738 to chamber 713 varies depending on the deposition and cleaning processes executed within chamber 713. Gases are introduced into chamber 713 through a gas ring 737 and/or a top nozzle 745. FIG. 6B is a simplified, partial cross-sectional view of chamber 713 showing additional details of gas ring 737.

In one embodiment, first and second gas sources, 734A and 734B, and first and second gas flow controllers, 735A' and 735B', provide gas to ring plenum 736 in gas ring 737 via gas delivery lines 738 (only some of which are shown). Gas ring 737 has a plurality of source gas nozzles 739 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 737 has 12 source gas nozzles made from an aluminum oxide ceramic.

Gas ring 737 also has a plurality of oxidizer gas nozzles 740 (only one of which is shown), which in a preferred embodiment are co-planar with and shorter than source gas nozzles 739, and in one embodiment receive gas from body plenum 741. In some embodiments it is desirable not to mix source gases and oxidizer gases before injecting the gases into chamber 713. In other embodiments, oxidizer gas and source gas may be mixed prior to injecting the gases into chamber 713 by providing apertures (not shown) between body plenum 741 and gas ring plenum 736. In one embodiment, third, fourth, and fifth gas sources, 734C, 734D, and 734D', and third and fourth gas flow controllers, 735C and 735D', provide gas to body plenum via gas delivery lines 738. Additional valves, such as 743B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 743B, to isolate chamber 713 from delivery line 738A and to vent delivery line 738A to vacuum foreline 744, for example. As shown in FIG. 6A, other similar valves, such as 743A and 743C, may be incorporated on other gas delivery lines. Such three-way valves may be placed as close to chamber 713 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 6A, chamber 713 also has top nozzle 745 and top vent 746. Top nozzle 745 and top vent 746 allow independent control of top and side flows of the gases, which improves film uniformity and allows fine adjustment of the film's deposition and doping parameters. Top vent 746 is an annular opening around top nozzle 745. In one embodiment, first gas source 734A supplies source gas nozzles 739 and top nozzle 745. Source nozzle MFC 735A' controls the amount of gas delivered to source gas nozzles 739 and top nozzle MFC 735A controls the amount of gas delivered to top gas nozzle 745. Similarly, two MFCs 735B and 735B' may be used to control the flow of oxygen to both top vent 746 and oxidizer gas nozzles 740 from a single source of oxygen, such as source 734B. The gases supplied to top nozzle 745 and top vent 746 may be kept separate prior to flowing the gases into chamber 713, or the gases may be mixed in top plenum 748 before they flow into chamber 713. Separate sources of the same gas may be used to supply various portions of the chamber.

A remote microwave-generated plasma cleaning system 750 is provided to periodically clean deposition residues from chamber components. The cleaning system includes a remote microwave generator 751 that creates a plasma from a cleaning gas source 734E (e.g., molecular fluorine, nitrogen trifluoride, other fluorocarbons or equivalents) in reactor cavity 753. The reactive species resulting from this plasma are conveyed to chamber 713 through cleaning gas feed port 754 via applicator tube 755. The materials used to contain the cleaning plasma (e.g., cavity 753 and applicator tube 755) must be resistant to attack by the plasma. The distance between reactor cavity 753 and feed port 754 should be kept as short as practical, since the concentration of desirable plasma species may decline with distance from reactor cavity 753. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 720, do not need to be covered with a dummy wafer or otherwise protected, as may be required with an in situ plasma cleaning process. In one embodiment, this cleaning system is used to dissociate atoms of the etchant gas remotely, which are then supplied to the process chamber 713. In another embodiment, the etchant gas is provided directly to the process chamber 713. In still a further embodiment, multiple process chambers are used, with deposition and etching steps being performed in separate chambers.

System controller 760 controls the operation of system 710. In a preferred embodiment, controller 760 includes a memory 762, such as a hard disk drive, a floppy disk drive (not shown), and a card rack (not shown) coupled to a processor 761. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 731 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 765, and a light pen 766, as depicted in FIG. 6C.

Figure 6C:
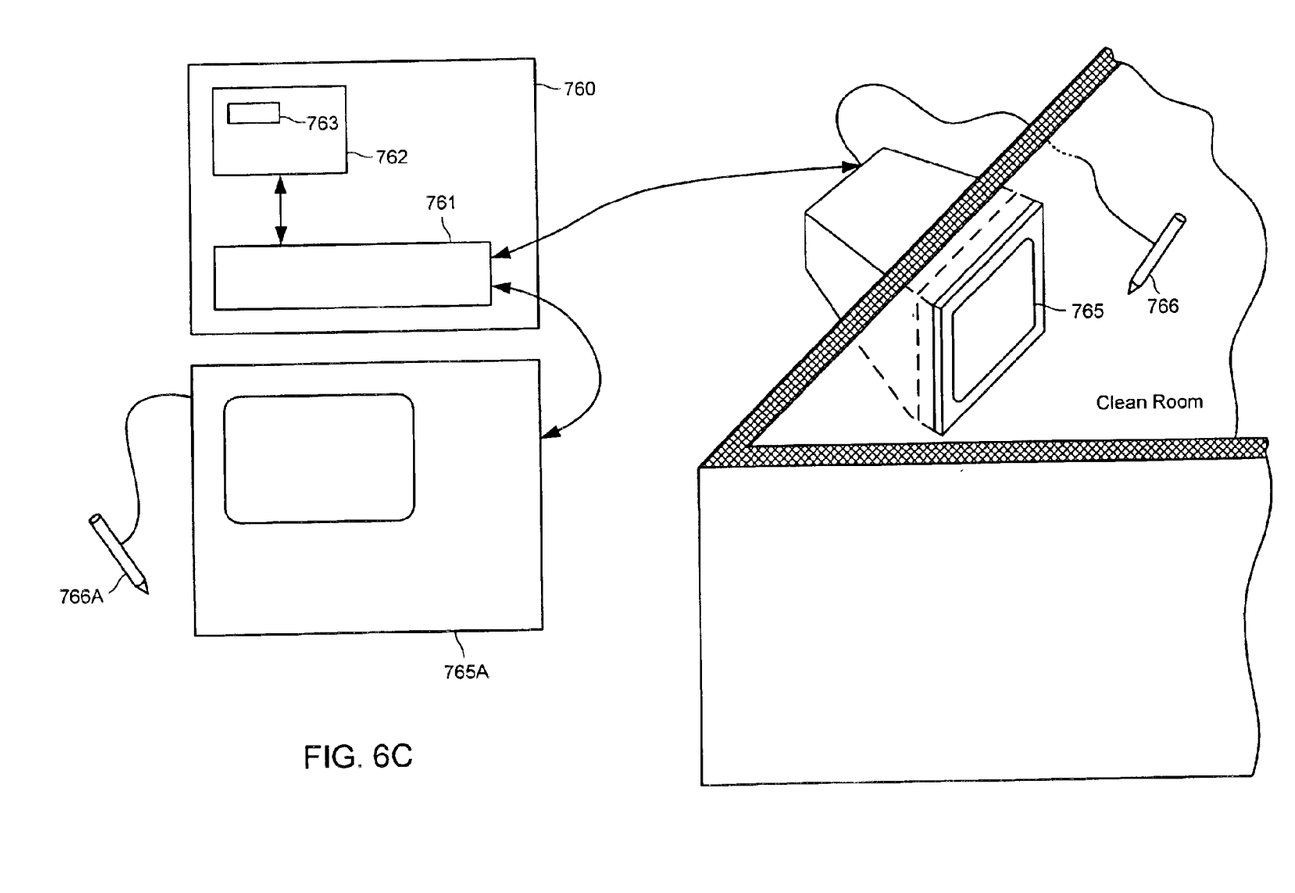
FIG. 6C is a simplified diagram of a monitor and light pen that may be used in conjunction with the exemplary CVD processing chamber of FIG. 2A.

FIG. 6C is an illustration of a portion of an exemplary system user interface used in conjunction with the exemplary CVD processing chamber of FIG. 6A. System controller 760 includes a processor 761 coupled to a computer-readable memory 762. Preferably, memory 762 may be a hard disk drive, but memory 762 may be other kinds of memory, such as ROM, PROM, and others.

System controller 760 operates under the control of a computer program 763 stored in a computer-readable format within memory 762. The computer program dictates the timing, temperatures, gas flows, RF power levels and other parameters of a particular process. The interface between a user and the system controller is via a CRT monitor 765 and a light pen 766, as depicted in FIG. 6C. In a preferred embodiment, two monitors, 765 and 765A, and two light pens, 766 and 766A, are used, one mounted in the clean room wall (665) for the operators and the other behind the wall (665A) for the service technicians. Both monitors simultaneously display the same information, but only one light pen (e.g. 766) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 6D:
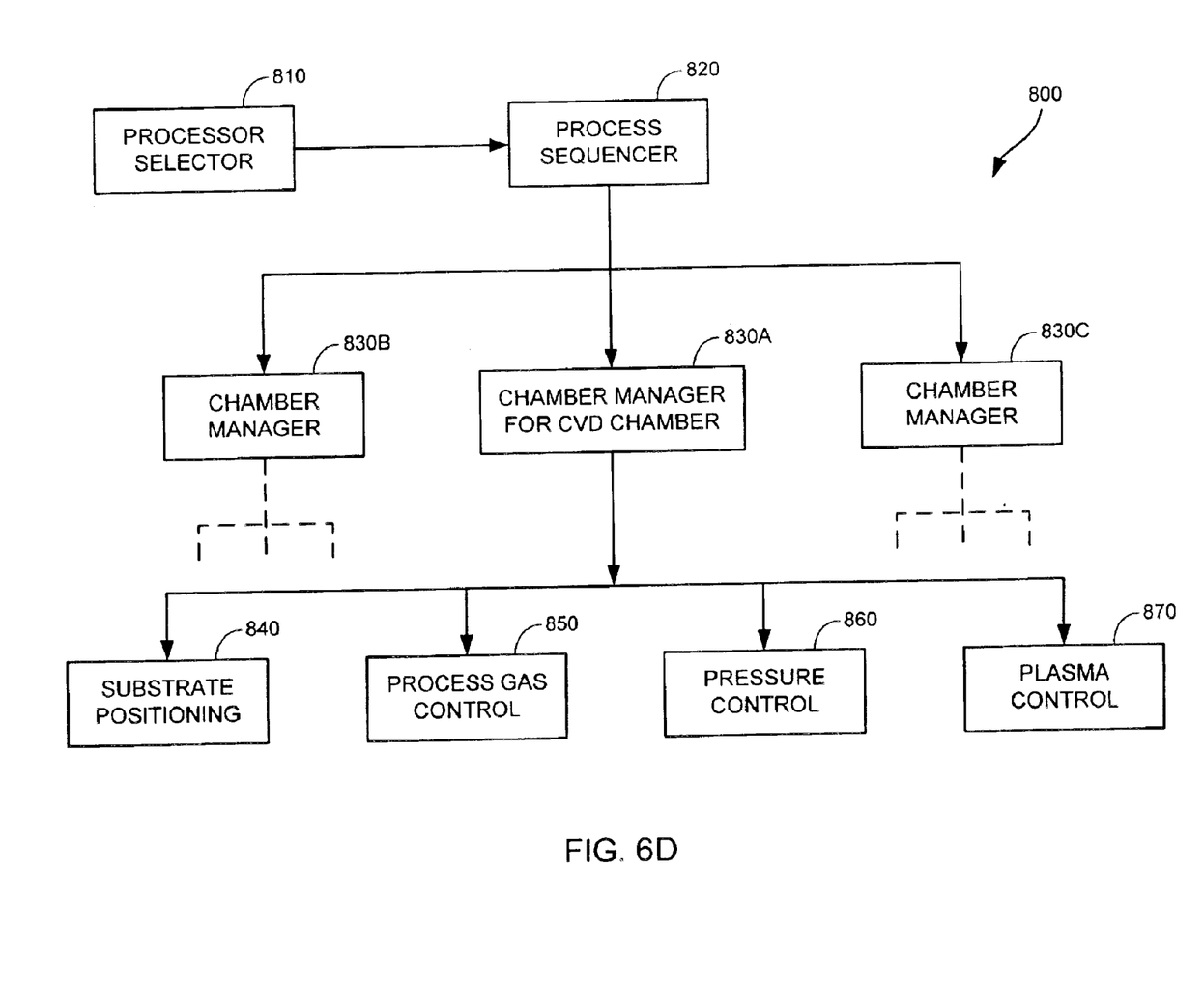
FIG. 6D is a flow chart of an exemplary process control computer program product used to control the exemplary CVD processing chamber of FIG. 2A.

FIG. 6D shows an illustrative block diagram of the hierarchical control structure of computer program 800. A user enters a process set number and process chamber number into a process selector subroutine 810 in response to menus or screens displayed on the CRT monitor by using the light pen interface. The process sets are predetermined sets of process parameters necessary to carry out specified processes, and are identified by predefined set numbers. Process selector subroutine 810 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 760, and the signals for controlling the process are output on the analog and digital output boards of system controller 760.

A process sequencer subroutine 820 comprises program code for accepting the identified process chamber and set of process parameters from the process selector subroutine 810 and for controlling operation of the various process chambers. Multiple users can enter process set numbers and process chamber numbers, or a single user can enter multiple process set numbers and process chamber numbers; sequencer subroutine 820 schedules the selected processes in the desired sequence. Preferably, sequencer subroutine 820 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 820 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 820 determines which process chamber and process set combination is going to be executed next, sequencer subroutine 820 initiates execution of the process set by passing the particular process set parameters to a chamber manager subroutine 830A–830C, which controls multiple processing tasks in chamber 713 and possibly other chambers (not shown) according to the process set sent by sequencer subroutine 820.

Examples of chamber component subroutines are substrate positioning subroutine 840, process gas control subroutine 850, pressure control subroutine 860, and plasma control subroutine 870. Those having ordinary skill in the art will recognize that other chamber control subroutines can be included depending on what processes are selected to be performed in chamber 713. In operation, chamber manager subroutine 830A selectively schedules or calls the process component subroutines in accordance with the particular process set being executed. Chamber manager subroutine 830A schedules process component subroutines in the same manner that sequencer subroutine 820 schedules the process chamber and process set to execute. Typically, chamber manager subroutine 830A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 6A and 6D. Substrate positioning subroutine 840 comprises program code for controlling chamber components that are used to load a substrate onto substrate support number 718. Substrate positioning subroutine 840 may also control transfer of a substrate into chamber 713 from, e.g., a plasma-enhanced CVD ("PECVD") reactor or other reactor in the multi-chamber system, after other processing has been completed.

Process gas control subroutine 850 has program code for controlling process gas composition and flow rates. Subroutine 850 controls the open/close position of the safety shut-off valves and also ramps up/ramps down the mass flow controllers to obtain the desired gas flow rates. All chamber component subroutines, including process gas control subroutine 850, are invoked by chamber manager subroutine 830A. Subroutine 850 receives process parameters from chamber manager subroutine 830A related to the desired gas flow rates.

Typically, process gas control subroutine 850 opens the gas supply lines, and repeatedly (i) reads the necessary mass flow controllers, (ii) compares the readings to the desired flow rates received from chamber manager subroutine 830A, and (iii) adjusts the flow rates of the gas supply lines as necessary. Furthermore, process gas control subroutine 850 may include steps for monitoring the gas flow rates for unsafe rates and for activating the safety shut-off valves when an unsafe condition is detected.

In some processes, an inert gas, such as argon, is flowed into chamber 713 to stabilize the pressure in the chamber before reactive process gases are introduced. For these processes, the process gas control subroutine 850 is programmed to include steps for flowing the inert gas into chamber 713 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 850 may include steps for bubbling a delivery gas such as helium through the liquid precursor in a bubbler assembly or for introducing the helium to a liquid injection valve. For this type of process, the process gas control subroutine 850 regulates the flow of the delivery gas, the pressure in the bubbler, and the bubbler temperature to obtain the desired process gas flow rates. As discussed above, the desired process gas flow rates are transferred to process gas control subroutine 850 as process parameters.

Furthermore, the process gas control subroutine 850 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 850 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine760 includes program code for controlling the pressure in chamber 713 by regulating the size of the opening of throttle valve 726 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 726 to a fixed position. Setting throttle valve 726 to a fixed position may eventually result in a steady-state pressure.

Alternatively, the chamber pressure may be measured, with a manometer for example, and the position of throttle valve 726 may be adjusted according to pressure control subroutine 860, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 860 is invoked, the desired, or target, pressure level is received as a parameter from chamber manager subroutine 830A. Pressure control subroutine 860 measures the pressure in chamber 713 by reading one or more conventional pressure manometers connected to the chamber; compares the measured value(s) to the target pressure; obtains proportional, integral, and differential (PID) values from a stored pressure table corresponding to the target pressure, and adjusts throttle valve 726 according to the PID values obtained from the pressure table. Alternatively, pressure control subroutine 860 may open or close throttle valve 726 to a particular opening size to regulate the pressure in chamber 713 to a desired pressure or pressure range.

Plasma control subroutine 870 comprises program code for controlling the frequency and power output setting of RF generators 731A and 731B and for tuning matching networks 732A and 732B. Plasma control subroutine 870, like the previously described chamber component subroutines, is invoked by chamber manager subroutine 830A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Exemplary Chemical Mechanical Polishing System

Figure 7:
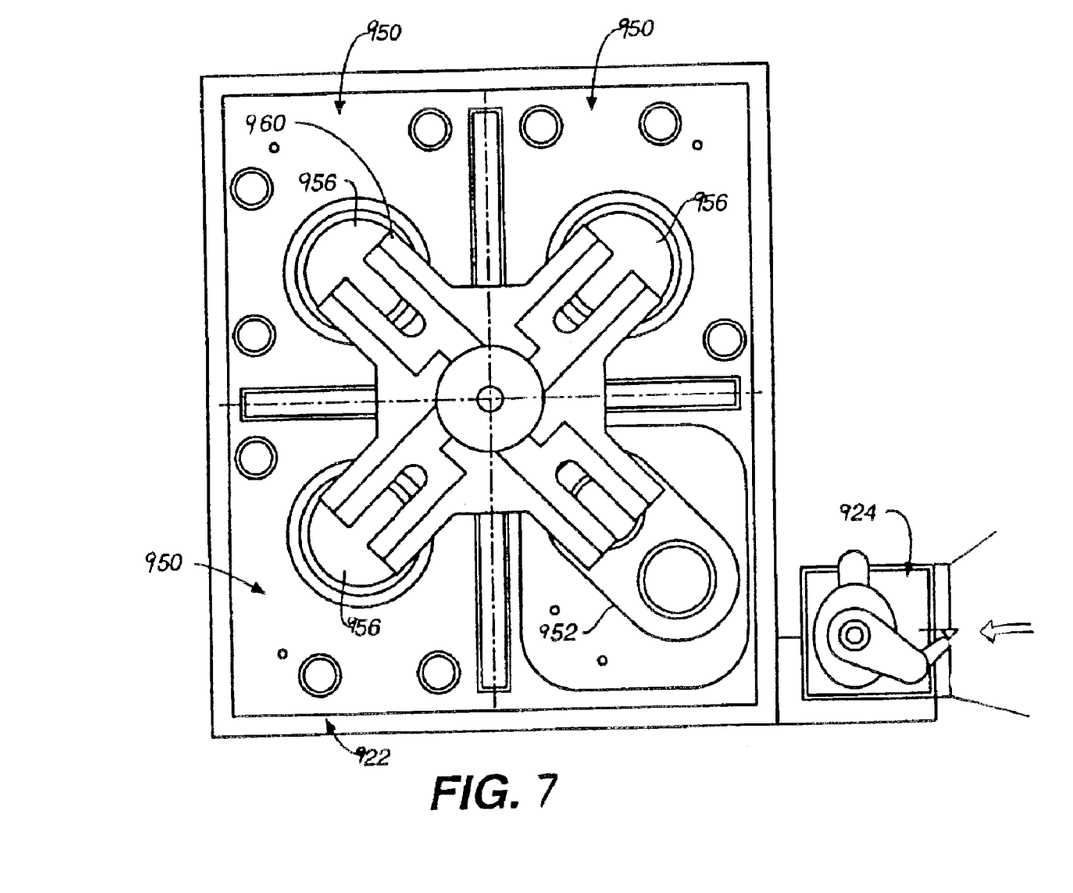
FIG. 7 is a simplified diagram of a CMP device that may be used with embodiments of the invention.

The polishing step may be performed by any suitable polisher. One example, illustrated in FIG. 7, is the Mirra® chemical mechanical polisher manufactured by APPLIED MATERIALS, INC. of Santa Clara, Calif. The chemical mechanical polisher 922 receives substrates from a robot 924 at a transfer station 952. The transfer station 952 may serve multiple functions in addition to receiving the substrates, including washing the substrates and loading the substrates into carrier heads. Typically, each polishing station includes a rotatable platen that supports a polishing pad 956, such as a fixed-abrasive pad. A rotatable carousel 960 that holds a plurality of carrier heads is supported above the polishing stations 950. The carousel 960 rotates to carry substrates between the polishing stations 950 and the transfer station 952. A chemical mechanical polishing process may be performed at any of the polishing stations. Further details of the Mirra® chemical mechanical polisher are described in commonly assigned U.S. Pat. No. 5,738,574, entitled "CONTINUOUS PROCESSING SYSTEM FOR CHEMICAL MECHANICAL POLISHING," by Robert D. Tolles et al., the entire disclosure of which is herein incorporated by reference for all purposes.

Experimental Tests of Uniformity

Figure 8A:
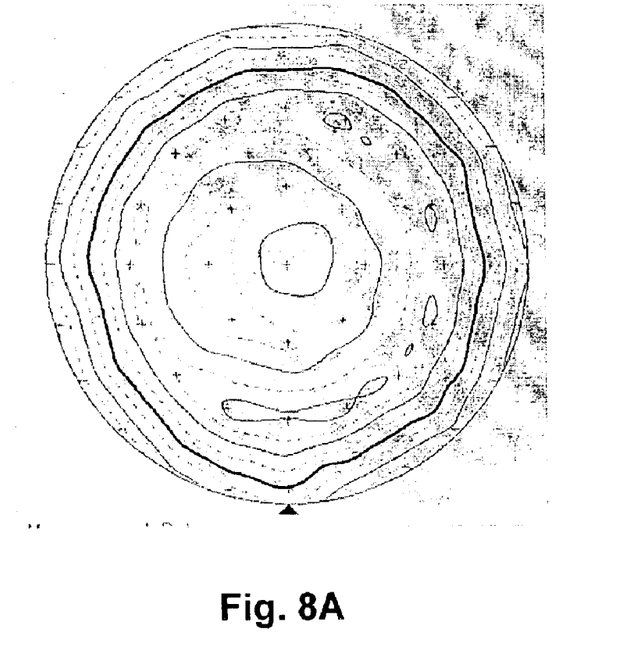
FIGS. 8A and 8B are contour graphs showing uniformity results for films deposited using different fluent-gas characteristics
Figure 8B:
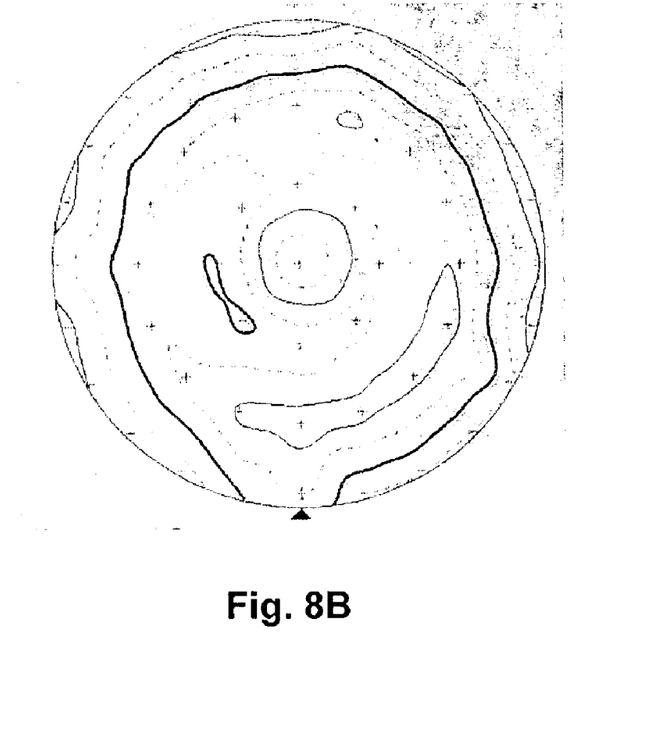

In order to better appreciate the benefits achievable by the methods of the invention, reference is now made to FIGS. 8A and 8B, which are contour plots depicting the results of experimental tests of uniformity under different fluent-gas flow conditions. Each of the experiments was performed on a 200-mm silicon wafer using $SiH_4$ and $O_2$ as precursor gases to deposit a silicon oxide film, and with He as the fluent gas. The results of FIG. 8A are shown for a purely side flow of He and the results of FIG. 8B are shown for a split flow of He. The total flow in each case was 300 sccm, with the side:top flow ratio being 1.4 in the case of the split He flow.

The uniformity of the layer may be quantified by calculating a one-σ standard deviation of a plurality of measurements over the deposited layer. Although other numbers of measurements may be made, one typical uniformity calculation is based on a 49-point assessment of the layer. Such a 49-point assessment was performed for each of the results shown in FIGS. 8A and 8B, and is summarized in the following table:

| Trial | Fluent-gas Flow (sccm) | | Thickness (Å) | Range (Å) | Uniformity (%) |
|---|---|---|---|---|---|
| | Top | Side | | | |
| FIG. 8A | 0 | 300 | 7831 | 682 | 3.2 |
| FIG. 8B | 125 | 175 | 7773 | 530 | 1.8 |

The results show that improved uniformity is achieved with the split He flow. In each of FIGS. 8A and 8B, the mean thickness is shown with the bold contour line and the other contour lines show 1% variations from the mean thickness. The results shown in FIG. 8A thus correspond to a deposited layer that is thicker in the center than at the periphery, a result of the increased sputter provided by the higher side flow of He. The results in FIG. 8B also show results in which the layer is thicker in the center, although this feature has been suppressed somewhat by shifting some of the fluent-gas flow to the top gas source. Further shifting of fluent-gas flow to the top gas source would thus provide a profile in which the periphery was thicker than the center of the substrate, and this effect could be enhanced further by shifting even more of the fluent-gas flow to the top gas source. This variety in profiles may thus be achieved without affecting the flow of the precursor gases, allowing specific profiles to be achieved to accommodate characteristics of the subsequent polishing step.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A method for forming a film over a substrate, the method comprising:

flowing a process gas into a process chamber having a first set of gas nozzles positioned to provide a flow of gas at a periphery of the substrate and a second set of gas nozzles positioned to provide a flow of gas above an upper surface of the substrate, the process gas including precursor gases and a fluent gas, wherein the fluent gas is flowed through the first and second sets of gas nozzles;

forming a high-density plasma from the process gas to deposit the film with a deposition process having simultaneous deposition and sputtering contributions to provide a net deposition rate that varies across the substrate in accordance with relative flow rates of the fluent gas through the first and second sets of nozzles;

polishing the film with a polishing process having an etch rate that varies across the substrate, wherein the net deposition and etch rates combine such that the film is substantially planar after polishing the film.

2. The method recited in claim 1 wherein polishing the film comprises performing a chemical mechanical polishing process on the film.

3. The method recited in claim 1 wherein the film has a uniformity less than 1% after polishing the film.

4. The method recited in claim 3 wherein the film has a uniformity greater than 1% after depositing the film and before polishing the film.

5. The method recited in claim 4 wherein the film has a uniformity between 5 and 7% after depositing the film and before polishing the film.

6. The method recited in claim 1 wherein the plasma has a density greater than $10^{11}$ ions/cm$^3$.

7. The method recited in claim 1 wherein the precursor gases comprise a silane and an oxygen-containing gas.

8. The method recited in claim 1 wherein the fluent gas comprises He.

9. The method recited in claim 1 wherein the fluent gas comprises $H_2$.

10. The method recited in claim 1 wherein a ratio of the flow of fluent gas through the side gas source to the flow of the fluent gas through the top gas source is between 0.1 and 50.

11. The method recited in claim 1 wherein a total flow rate of the fluent gas is between 10 and 1000 sccm.

12. The method recited in claim 1 wherein the net deposition rate is lower at the center of the film than at a periphery of the film.

13. A method for forming a film over a substrate, the method comprising:

flowing a process gas into a process chamber having a first set of gas nozzles positioned to provide a flow of gas at a periphery of the substrate and a second set of gas nozzles positioned to provide a flow of gas above an upper surface of the substrate, the process gas including precursor gases and a fluent gas, wherein the fluent gas is flowed through the first and second sets of gas nozzles;

forming a high-density plasma from the process gas to deposit the film over the substrate with a uniformity greater than 1% using a deposition process having simultaneous deposition and sputtering contributions to provide a net deposition rate that varies across the substrate in accordance with the relative flow rates of the fluent gas through the first and second set of gas nozzles, the film being generally thicker at the periphery of the substrate than at the center of the substrate; and polishing the film, wherein the uniformity of the film after polishing is less than 1%.

14. The method recited in claim 13 wherein the fluent gas comprises He.

15. The method recited in claim 13 wherein the fluent gas comprises $H_2$.

16. The method recited in claim 13 wherein a ratio of the flow of the fluent gas through the second set of gas nozzles to the flow of the fluent gas through the first set of gas nozzles is between 0.1 and 50.

17. The method recited in claim 13 wherein a total flow rate of the fluent gas is between 10 and 1000 sccm.

18. A method for forming a planarized film over a substrate having a center and a periphery using a chemical mechanical polishing process known to polish material in the periphery of the substrate at a first rate that is different from a second rate at which it polishes material in the center of the substrate, the method comprising:

flowing a process gas into a process chamber having a first set of gas nozzles positioned to provide a flow of gas at a periphery of the substrate and a second set of gas nozzles positioned to provide a flow of gas above an upper surface of the substrate, the process gas including precursor gases and a fluent gas, wherein the fluent gas is flowed through the first and second sets of gas nozzles;

forming a high-density plasma from the process gas to deposit the film over the substrate using a high-density plasma chemical vapor deposition process that has simultaneous deposition and sputtering contributions and deposits material in the periphery of the substrate at a third rate that is different from a fourth rate at which it deposits material in the center of the substrate in accordance with relative flow rates of the fluent gas through the first and second nozzles; and polishing the layer of film using the chemical mechanical polishing process, wherein either (1) the first rate is faster than the second rate and the third rate is faster than the fourth rate or (2) the first rate is slower than the second rate and the third rate is slower than the fourth rate.

19. The method recited in claim 18 wherein the film has a uniformity of 1% or less after the polishing process.

20. The method recited in claim 19 wherein the film has a uniformity greater than 1% after depositing the film and before polishing the film.

21. The method recited in claim 19 wherein the film has a uniformity greater than 5% after depositing the film and before polishing the film.

22. The method recited in claim 19 wherein the film has a uniformity between 5 and 7% after depositing the film and before polishing the film.

* * * * *